United States Patent
Tong et al.

(10) Patent No.: US 6,528,420 B1
(45) Date of Patent: Mar. 4, 2003

(54) DOUBLE ACTING COLD TRAP

(75) Inventors: Wei Hua Tong, Singapore (SG); Chen Yu Yang, Singapore (SG); Jian Zhang, Singapore (SG); Qian Wu Quan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/053,332

(22) Filed: Jan. 18, 2002

(51) Int. Cl.$^7$ .................... H01L 21/44; H01L 21/469
(52) U.S. Cl. ........................... 438/680; 438/791
(58) Field of Search ........................ 438/680, 681, 438/791, 905; 427/585, 588

(56) References Cited

U.S. PATENT DOCUMENTS

| | | | |
|---|---|---|---|
| 6,066,209 A | * 5/2000 | Sajoto et al. | 118/715 |
| 6,106,626 A | 8/2000 | Guan et al. | 118/715 |
| 6,107,198 A | 8/2000 | Lin et al. | 438/680 |
| 6,139,640 A | 10/2000 | Ramos et al. | 118/715 |
| 6,165,272 A | 12/2000 | Liu | 118/715 |
| 6,206,971 B1 | * 3/2001 | Umotoy et al. | 118/715 |
| 6,241,793 B1 | 6/2001 | Lee et al. | 55/434.2 |
| 6,258,170 B1 | * 7/2001 | Somekh et al. | 118/715 |

* cited by examiner

Primary Examiner—Alexander Ghyka
(74) Attorney, Agent, or Firm—George O. Saile; Rosemary L. S. Pike

(57) ABSTRACT

A double acting cold trap equipped with a set of exhaust gas condensing fins and a set of exhaust gas condensing plates is disclosed. The invention also discloses a double acting cold trap that incorporates a deflecting plate to direct the exhaust gases over the condensing fins and plates in a serial fashion. This increases the efficiency of the collection of unwanted particles.

6 Claims, 4 Drawing Sheets

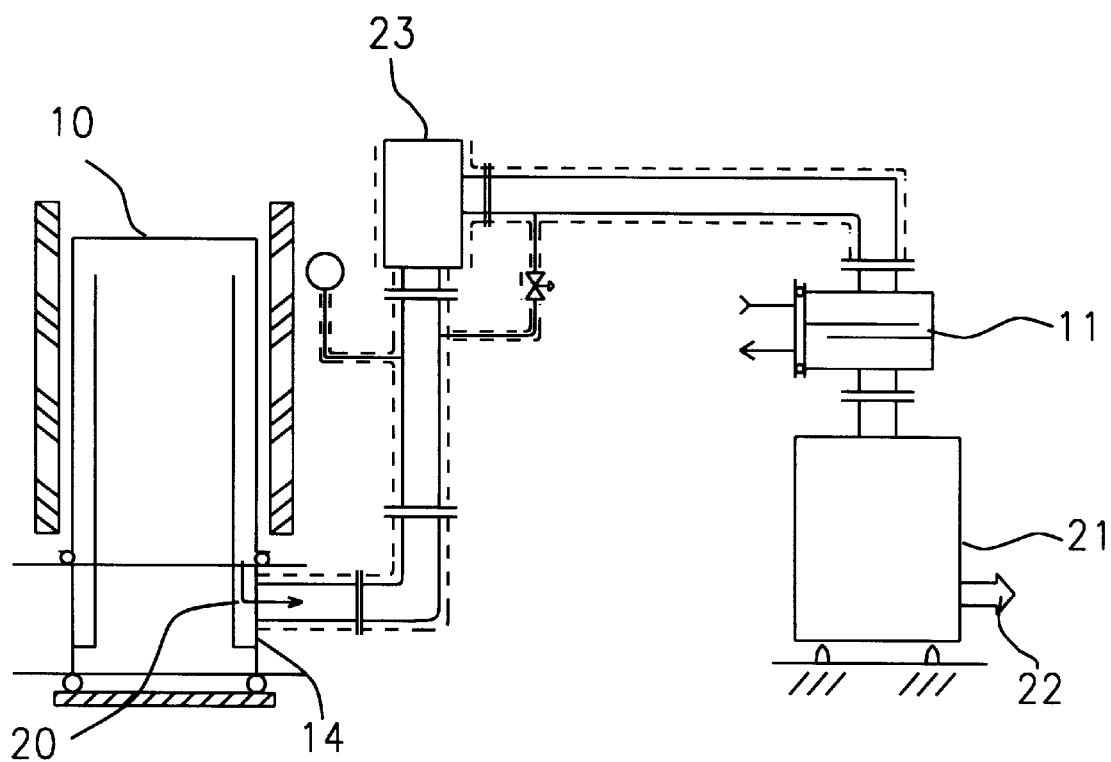
FIG. 1 - Prior Art

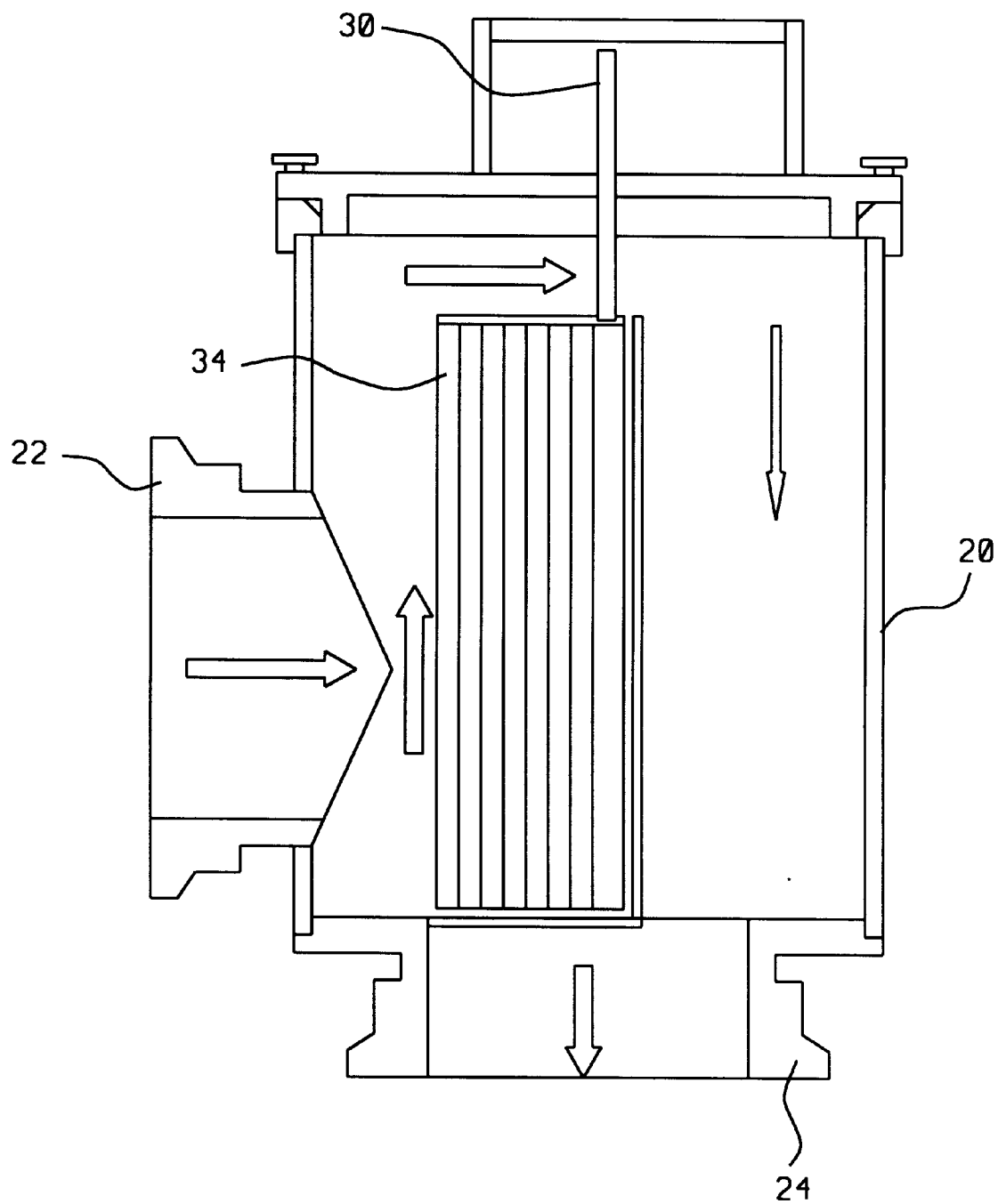
FIG. 2 – Prior Art

DOUBLE ACTING COLD TRAP

BACKGROUND OF THE INVENTION (1) Technical Field

This invention relates generally to an apparatus used in a semiconductor manufacturing process for effectively collecting unwanted by-products in the exhaust gases of a low pressure chemical vapor deposition film fabrication process.

(2) Description of Prior Art

The following four U.S. Patents relate to cold traps for reducing source material from a reaction chamber.

U. S. Pat. No. 6,24,793b1 issued Jun. 5, 2001, to Jui-Hsiung Lee et al. disclosing a cold trap with a curvilinear cooling plate.

U. S. Pat. No. 6,107,198 issued Aug. 22, 2000, to Wei-Farn Lin discloses an apparatus and method for reducing process solid buildup by using an exhaust circuit of cold traps and heating and cooling elements.

U. S. Pat. No. 6,165,272 issued Dec. 26, 2000, to Wei-Jen Lin et al. discloses an apparatus for preventing contamination to a LPCVD chamber by using a valved exhaust vent connected to a vacuum pump.

U. S. Pat. No. 6,139,640 issued Oct. 31, 2000, to Jesse C. Ramos et al. describing a LPCVD system utilizing a mass flow rate controller for gases passing from a reaction chamber to a vacuum pump.

LPCVD is a method used to deposit thin films on semiconductor substrates. Silicon nitride is one film that is used extensively as a mask for diffusion, passivation, or as a gate dielectric in memory devices. Silicon nitride is usually formed by the LPCVD method in deposition equipment similar to the one shown in FIG. 1. (Prior Art.)

The LPCVD method typically uses dichlorosilane as the reactant gas with ammonia in a hot-wall LPCVD vertical furnace unit 10 at a temp. 700° C.–800° C. with a chamber pressure of several hundred m Torr. During the silicon nitride deposition using the method described above, a reaction by-product is formed. This by-product is usually ammonium chloride in the form of a fine powder. This powder is deposited on any cold surface in the ducting of the LPCVD system or may be siphoned back into the reaction chamber during the film deposition process. The results of the above are that the ducting of the system requires frequent maintenance for cleaning the residue, more importantly it increases the defect density of the product which in turn will reduce the product yield of the process.

A method for reducing the effects of the ammonium chloride powder is to include a cold trap in the LPCVD system that provides an internal cold surface area for the ammonium chloride powder to condense on. FIG. 1 is a schematic of typical LPCVD systems. The typical system includes a LPCVD reactor 10 which has an exhaust outlet 14, a main pressure valve 23, a cold trap 11, and a main vacuum pump 21. During the deposition of the silicon nitride film on semiconductor wafers positioned in the furnace 10, the furnace exhaust gas 20, which contains unreacted gases, and the reaction by- product ammonium chloride powder is sent through a cold trap 11 and then released to the factory exhaust system 22. The ability and efficiency of the cold trap 11 is an important feature of the system as it affects the defect density of the process and, thereby, product yield and the frequency of maintenance.

A cross-sectional view of a conventional cold trap is shown in FIG. 2 (Prior Art).

The cold trap is normally constructed of a cylindrical housing 20 with gas inlet and outlet ports 22, 24 arranged as shown in FIG. 2. The housing also supports a cooling plate 34. The cooling plate is comprised of hollow fins that contain a cooling fluid which circulates through the fins. Cooling fluid lines are also provided and supported by the cold trap housing. The cooling fins provide a large cold surface for the deposition and collection of the ammonium chloride powder. This action prevents the ammonium chloride powder from backstreaming into the reaction chamber and producing defects on the product wafers. In the present configuration of cold traps shown in FIG. 2 the cold trap requires cleaning of the ammonium chloride powder from the internal surfaces after every 20–25 hours of operation. The requirement for cleaning requires system downtime.

SUMMARY OF THE INVENTION

The present invention objective is to provide a cold trap that can be used in a semiconductor fabrication process for collecting unwanted particles more effectively than current cold traps are capable of doing.

A further objective of the present invention is to provide a cold trap that can be used in a semiconductor material deposition system which by its use increases the time between cleaning cycles, therefore decreasing system downtime.

Another objective of the present invention is to provide a cold trap with increased cooled surface area for the deposition of unwanted particles.

An additional objective of the present invention is to provide a gas deflecting plate that directs the gas over a second set of cooling fins to allow for a larger area for deposition of unwanted particles.

A further objective of the invention is to provide a second set of cooling fins so shaped as to provide additional cold surface area for deposition of unwanted particles.

It is also the objective of the invention to provide cooling fins so shaped as to minimize the impedance to gas flow.

The above objectives are achieved by the present invention by providing a double acting cold trap that incorporates a cylindrical housing with exhaust gas inlet and outlet ports arranged at 90°. Internal to the cylindrical housing are a set of condensing fins and a set of condensing plates. A deflecting plate is incorporated between the condensing fins and condensing plates that directs the exhaust gases in a serial fashion over the condensing surfaces. Input and output fittings for the cooling fluid are incorporated on the stainless steel housing and the fluid loop is so arranged as to provide fluid to the condensing fins and condensing plates in a closed circulating loop.

DESCRIPTION OF THE DRAWINGS

FIG. 1 is a schematic of a LPCVD system of the prior art.

FIG. 2 is a cross sectional view of a cold trap of the prior art.

DETAILED DESCRIPTION OF THE PREFERRED EMBODIMENT

Silicon nitride films are widely used in semiconductor wafer processing. A LPCVD system is the preferred method for depositing the silicon nitride film. During the chemical reactions of the process unwanted particles such as ammonium chloride powder are formed in the reaction chamber. In order to minimize the deleterious effects of these contaminants, increased defect density on the product, and increased cleaning frequency of LPCVD system, a cold trap is incorporated in the system. FIG. 1 unit 11.

The present invention discloses a double acting cold trap for collecting the unwanted particles such as ammonium chloride, as described above.

In the present invention double acting cold trap, a cylindrical housing is used to support a deflecting plate and two sets of cooling fins. The housing also contains a gas inlet port on the cylindrical surface of the housing and a gas outlet port perpendicular to the gas inlet port. The housing also incorporates a sealing plate on the opposite end of the gas outlet port that provides inlet and outlet connections for the cooling water that flows through the cooling fins.

Figure 3A:
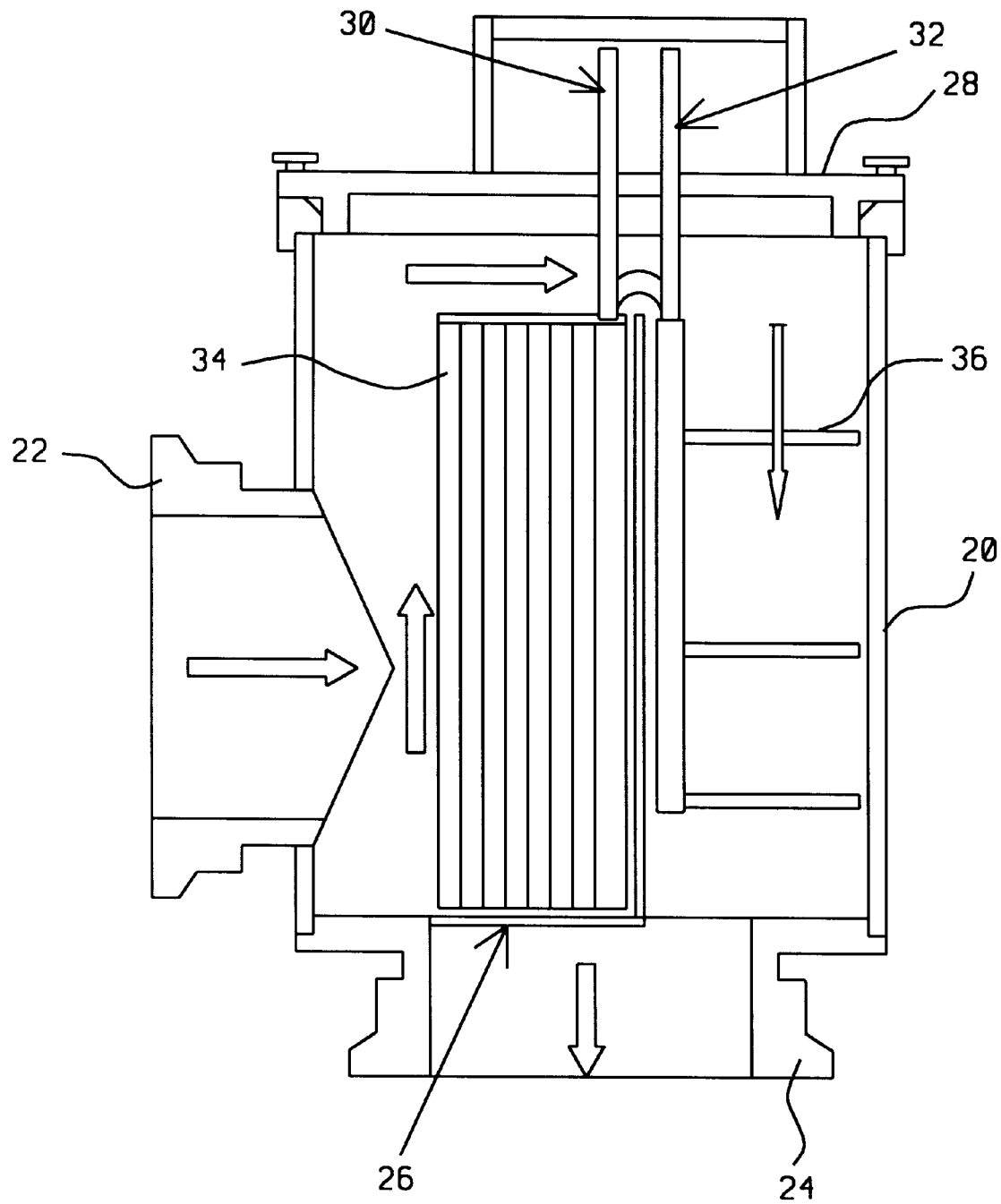
FIGS. 3a, 3b, 3c are cross sectional views of the double acting cold trap as described in this invention.

FIG. 3a is a cross section of the double acting cold trap, the present invention. The double acting cold trap is constructed using a cylindrical housing 20. The housing 20 is provided with a gas inlet port 22, and a gas outlet port 24 perpendicular to the gas inlet port 22.

Internal to the cylindrical housing 20 is mounted a gas deflecting plate 26 which directs the exhaust gases over the sequenced cold condensing plates. Mounted on the opposite end of the gas outlet is a plate 28 which supports the cooling water inlet 30 and the cooling water outlet 32. The cooling water piping inlet and outlet are so designed as to support and provide cooling water to the first plurality of cooling fins 34 parallel to the exhaust gas flow, and to support and provide cooling water to the plurality of cooling plates 36 perpendicular to the exhaust gas flow.

Figure 3B:
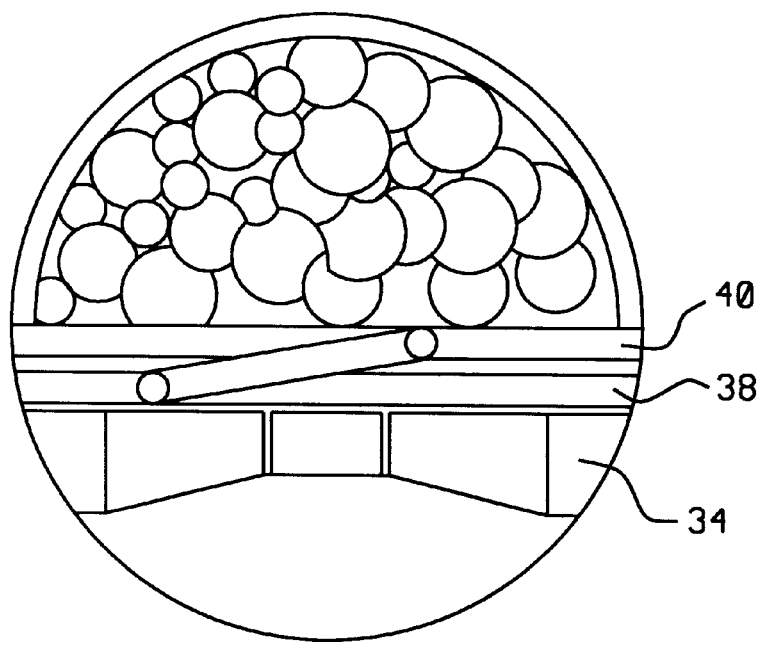
Figure 3C:
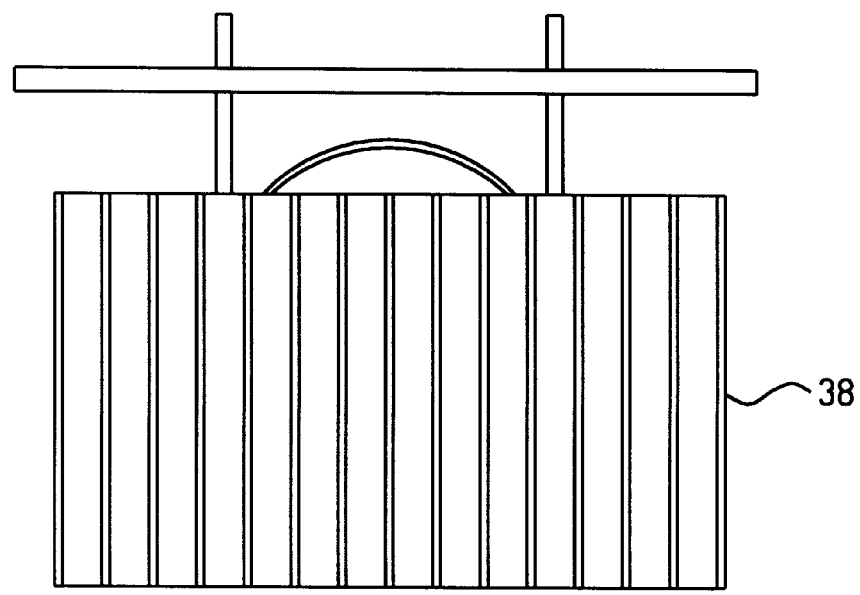

FIG. 3b is a bottom view of the double acting cold trap showing the configuration of the two sets of condensing cold plates 38, 40. Item 38 of FIG. 3b is the first exhaust gas condensing cold plate which incorporates a set of cooling fins 34 which provides a large area for condensation and collection of unwanted particles. Item 40 of FIG. 3b is the second exhaust gas condensing cold plate which incorporates a series of cooling plates with holes to allow the flow of gas. These cooling plates provide additional area for condensation and collection of unwanted particles. FIG. 3c is a plan view with the housing removed of the first set of cooling fins item 38.

In the arrangement of the present invention as shown in FIG. 3a, the plurality of condensing cold plate fins and plates 34, 36 exposed to the exhaust gases has been shown to result in lower defect densities on the product and longer periods between required major preventive maintenance.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of collecting unwanted by-products, reactants and particles in exhaust gases of a low pressure CVD system comprising the steps of:

Providing a cylindrical steel housing;

Providing a gas inlet port on a side of the cylindrical steel housing;

Providing a gas outlet port on the bottom of the cylindrical steel housing;

Providing a gas condensing apparatus with cooling liquid inlet and outlet fittings, condensing fins parallel, and plates perpendicular to the gas flow, And flowing said exhaust gases over said fins and plates.

2. The method of claim 1 by the use of a double acting cold trap utilizing said condensing fins and plates, wherein said condensing fins and plates are so arranged as to allow the exhaust gases to first pass over the condensing fins and secondly over the condensing plates.

3. The method of claim 2 wherein said double acting cold trap utilizes said condensing fins and plates so arranged as to maximize the condensing surface area presented to the exhaust gases.

4. The method of claim 2 wherein said condensing fins and condensing plates are connected and arranged to allow for the utilization of common liquid input and output fittings.

5. The method of claim 1 wherein a deflecting plate is utilized that directs the exhaust gases over the condensing fins; and secondly, over the condensing plates of an LPCVD cold trap.

6. The method of claim 1, further comprising arranging holes in the condensing plates so as to minimize resistance to the flow of exhaust gases while maximizing the surface area of the condensing plates in contact with the exhaust gases.

* * * * *